US012628660B2

(12) United States Patent
Shibata et al.

(10) Patent No.: US 12,628,660 B2
(45) Date of Patent: May 12, 2026

(54) METHOD FOR MANUFACTURING ELECTRONIC COMPONENT DEVICE AND ELECTRONIC COMPONENT DEVICE

(71) Applicant: Resonac Corporation, Tokyo (JP)

(72) Inventors: Tomoaki Shibata, Tokyo (JP); Naoya Suzuki, Tokyo (JP)

( * ) Notice: Subject to any disclaimer, the term of this patent is extended or adjusted under 35 U.S.C. 154(b) by 477 days.

(21) Appl. No.: 18/043,582

(22) PCT Filed: Aug. 31, 2021

(86) PCT No.: PCT/JP2021/031877
§ 371 (c)(1),
(2) Date: Mar. 1, 2023

(87) PCT Pub. No.: WO2022/050256
PCT Pub. Date: Mar. 10, 2022

(65) Prior Publication Data
US 2023/0268195 A1 Aug. 24, 2023

(30) Foreign Application Priority Data

Sep. 2, 2020 (WO) .................. PCT/JP2020/033259

(51) Int. Cl.
| | |
|---|---|
| *H01L 21/48* | (2006.01) |
| *H01L 21/56* | (2006.01) |
| *H01L 21/683* | (2006.01) |
| *H01L 23/00* | (2006.01) |
| *H01L 23/31* | (2006.01) |
| *H01L 23/538* | (2006.01) |
| *H01L 23/552* | (2006.01) |

(52) U.S. Cl.
CPC ...... *H01L 21/4857* (2013.01); *H01L 21/4853* (2013.01); *H01L 21/565* (2013.01);
(Continued)

(58) Field of Classification Search
CPC ............. H01L 21/4857; H01L 21/4853; H01L 21/565; H01L 21/568; H01L 21/6835;
(Continued)

(56) References Cited

U.S. PATENT DOCUMENTS

2009/0278219 A1* 11/2009 Morrison .............. H10F 39/024
257/E31.119
2014/0252646 A1 9/2014 Hung et al.
(Continued)

FOREIGN PATENT DOCUMENTS

| JP | 2001-284870 | 10/2001 |
|---|---|---|
| JP | 2004-228253 | 8/2004 |

(Continued)

OTHER PUBLICATIONS

International Search Report dated Nov. 10, 2020 for PCT/JP2020/033259.

(Continued)

*Primary Examiner* — Marlon T Fletcher
*Assistant Examiner* — Christina A Sylvia
(74) *Attorney, Agent, or Firm* — SHIPWAY IP

(57) ABSTRACT

A method for manufacturing an electronic component device including: preparing a wiring structure having a wiring portion including a metal wiring and an insulating layer and having two main surfaces opposite to each other, and a connection portion provided on one of the main surfaces of the wiring portion; fixing one or more conductor pins on the wiring substrate in a state in which the one or more conductor pins stand against the connection portion; mounting one or more electronic components on the wiring structure; and forming an encapsulation layer for encapsulating the electronic component and the conductor pin on the wiring structure.

13 Claims, 9 Drawing Sheets

(52) U.S. Cl.
CPC ........ *H01L 21/568* (2013.01); *H01L 21/6835* (2013.01); *H01L 23/3128* (2013.01); *H01L 23/5383* (2013.01); *H01L 23/5386* (2013.01); *H01L 23/5389* (2013.01); *H01L 23/552* (2013.01); *H01L 24/19* (2013.01); *H01L 24/20* (2013.01); *H01L 2221/68372* (2013.01); *H01L 2224/214* (2013.01); *H01L 2924/3025* (2013.01)

(58) Field of Classification Search
CPC ............. H01L 23/3128; H01L 23/5383; H01L 23/5386; H01L 23/5389; H01L 23/552; H01L 24/19; H01L 24/20; H01L 2221/68372; H01L 2224/214; H01L 2924/3025; H01L 25/0655; H01L 2224/81193; H01L 23/49816; H01L 2221/68345; H01L 2221/68359; H01L 23/49811
See application file for complete search history.

(56)                References Cited

U.S. PATENT DOCUMENTS

| | | | | |
|---|---|---|---|---|
| 2015/0043189 | A1* | 2/2015 | Kitazaki | ............... H05K 3/244 |
| | | | | 29/832 |
| 2015/0179616 | A1* | 6/2015 | Lin | ..................... H01L 23/3121 |
| | | | | 257/773 |
| 2018/0092257 | A1* | 3/2018 | Otsubo | .................. H05K 1/181 |
| 2018/0277489 | A1 | 9/2018 | Han et al. | |
| 2018/0366439 | A1* | 12/2018 | Lin | ................... H01L 23/49838 |
| 2019/0148274 | A1* | 5/2019 | Yu | ........................... H01L 24/83 |
| | | | | 257/668 |

FOREIGN PATENT DOCUMENTS

| | | |
|---|---|---|
| JP | 2012-019091 | 1/2012 |
| JP | 2013-021359 | 1/2013 |
| JP | 5494766 | 5/2014 |
| JP | 2019-068020 | 4/2019 |
| WO | 2015/186744 | 12/2015 |
| WO | 2016/181954 | 11/2016 |
| WO | 2017/057355 | 4/2017 |
| WO | 2017/094836 | 6/2017 |
| WO | 2018/101381 | 6/2018 |
| WO | 2018/180939 | 10/2018 |

OTHER PUBLICATIONS

International Search Report dated Nov. 22, 2021 for PCT/JP2021/031877.
International Preliminary Report on Patentability with Written Opinion dated Mar. 16, 2023 for PCT/JP2020/033259.
International Preliminary Report on Patentability with Written Opinion dated Mar. 16, 2023 for PCT/JP2021/031877.

* cited by examiner (a)

(b)

(a)

(b)

(a)

(b)

(a)

(b)

(a)

(b)

(c)

(a)

(b)

METHOD FOR MANUFACTURING ELECTRONIC COMPONENT DEVICE AND ELECTRONIC COMPONENT DEVICE

CROSS-REFERENCE TO RELATED APPLICATIONS

This application is a 35 U.S.C. § 371 national phase application of PCT/JP2021/031877, filed on Aug. 31, 2021, which claims priority to International Application No. PCT/JP2020/033259, filed on Sep. 2, 2020.

TECHNICAL FIELD

The present disclosure relates to a method for manufacturing an electronic component device and an electronic component device.

BACKGROUND ART

In various semiconductor packages, a conductive via penetrating through an encapsulation layer that encapsulates a semiconductor chip may be provided (for example, Patent Literature 1). A conventional method of forming a conductive via penetrating through the encapsulation layer includes an electroplating step.

CITATION LIST

Patent Literature

Patent Literature 1: U.S. Patent Application Publication No. 2014/252646
Patent Literature 2: International Publication WO 2017/057355
Patent Literature 3: Japanese Patent No. 5494766
Patent Literature 4: International Publication WO 2015/186744

SUMMARY OF INVENTION

Technical Problem

One aspect of the present disclosure makes it possible to manufacture an electronic component having a conductive via penetrating through an encapsulation layer that encapsulates the electronic component, with a simpler process.

Solution to Problem

According to an aspect of the present disclosure, there is provided a method for manufacturing an electronic component device including: preparing a wiring structure having a wiring portion including a metal wiring and an insulating layer and having two main surfaces opposite to each other, and a connection portion provided on one of the main surfaces of the wiring portion; fixing one or more conductor pins on the wiring structure in a state in which the one or more conductor pins stand against the connection portion; mounting one or more electronic components on the wiring structure; and forming an encapsulation layer for encapsulating the electronic component and the conductor pin on the wiring structure.

According to another aspect of the present disclosure, there is provided an electronic component device including: a wiring structure having a wiring portion including a metal wiring and an insulating layer and having two main surfaces opposite to each other, and a connection portion provided on one of the main surfaces of the wiring portion; one or more electronic components mounted on the wiring structure; an encapsulation layer encapsulating the electronic component and being formed on the wiring structure; and one or more conductor pins penetrating through the encapsulation layer in a state in which the one or more conductor pins stand against the connection portion.

Advantageous Effects of Invention

According to an aspect of the present disclosure, an electronic component device having a conductive via penetrating through an encapsulation layer can be efficiently and easily manufactured with a small number of steps. The method according to an aspect of the present disclosure is also advantageous in that a conductive via having a narrow width and a predetermined height can be easily formed.

DESCRIPTION OF EMBODIMENTS

Figure 1:
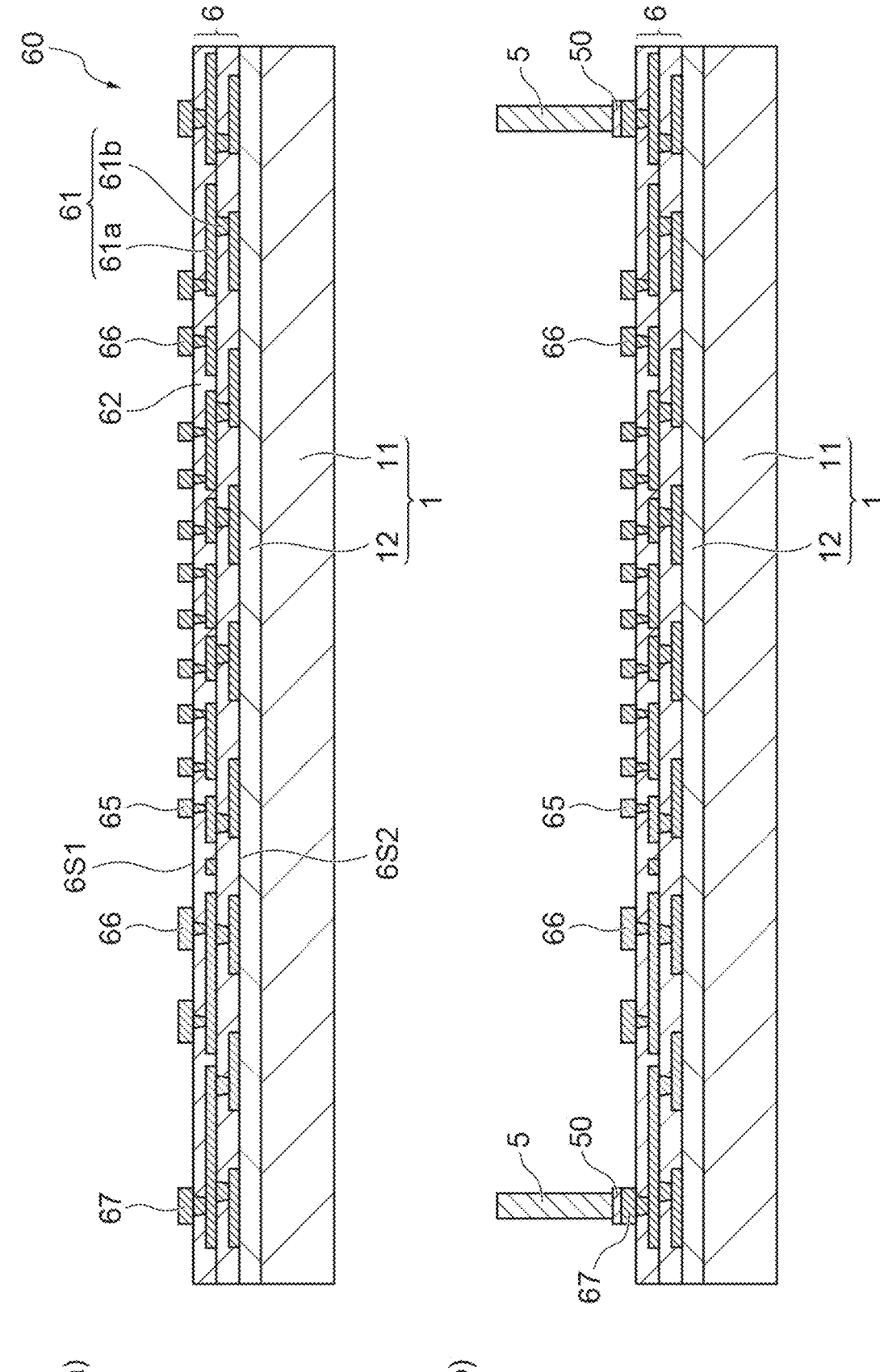
FIG. 1 is a process diagram showing an example of a method for manufacturing an electronic component device.
Figure 2:
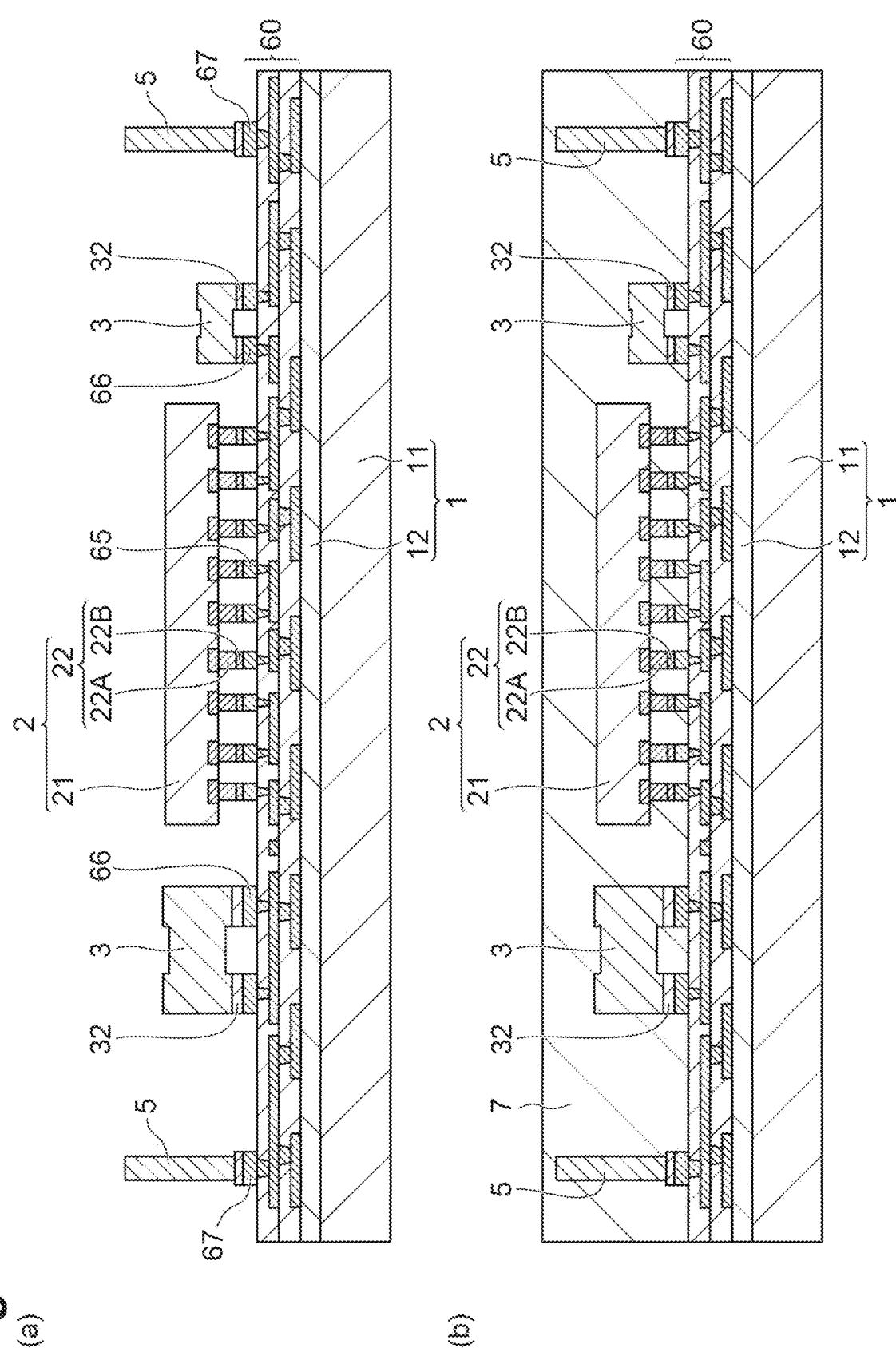
FIG. 2 is a process diagram showing an example of a method for manufacturing an electronic component device.
Figure 3:
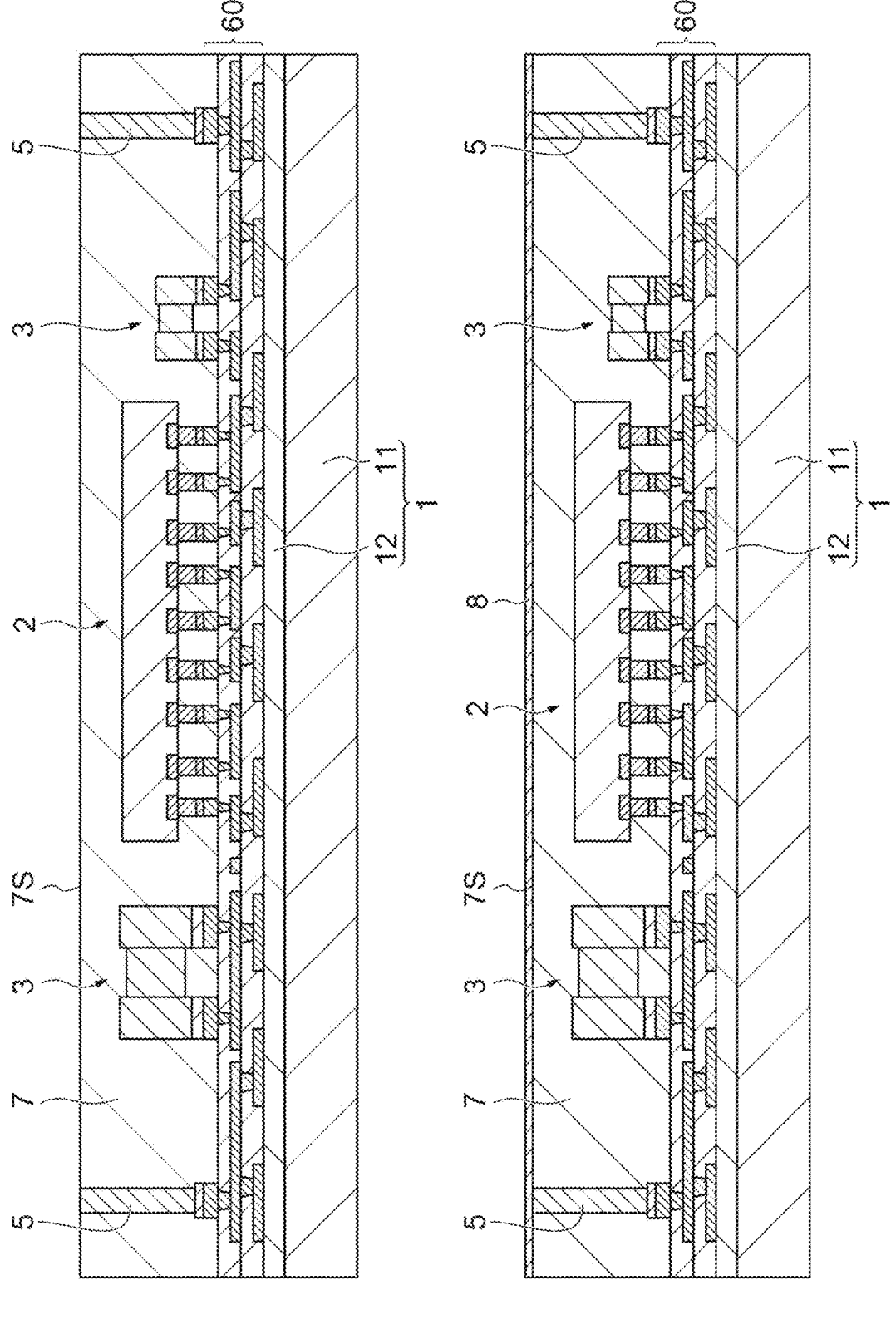
FIG. 3 is a process diagram showing an example of a method for manufacturing an electronic component device.
Figure 4:
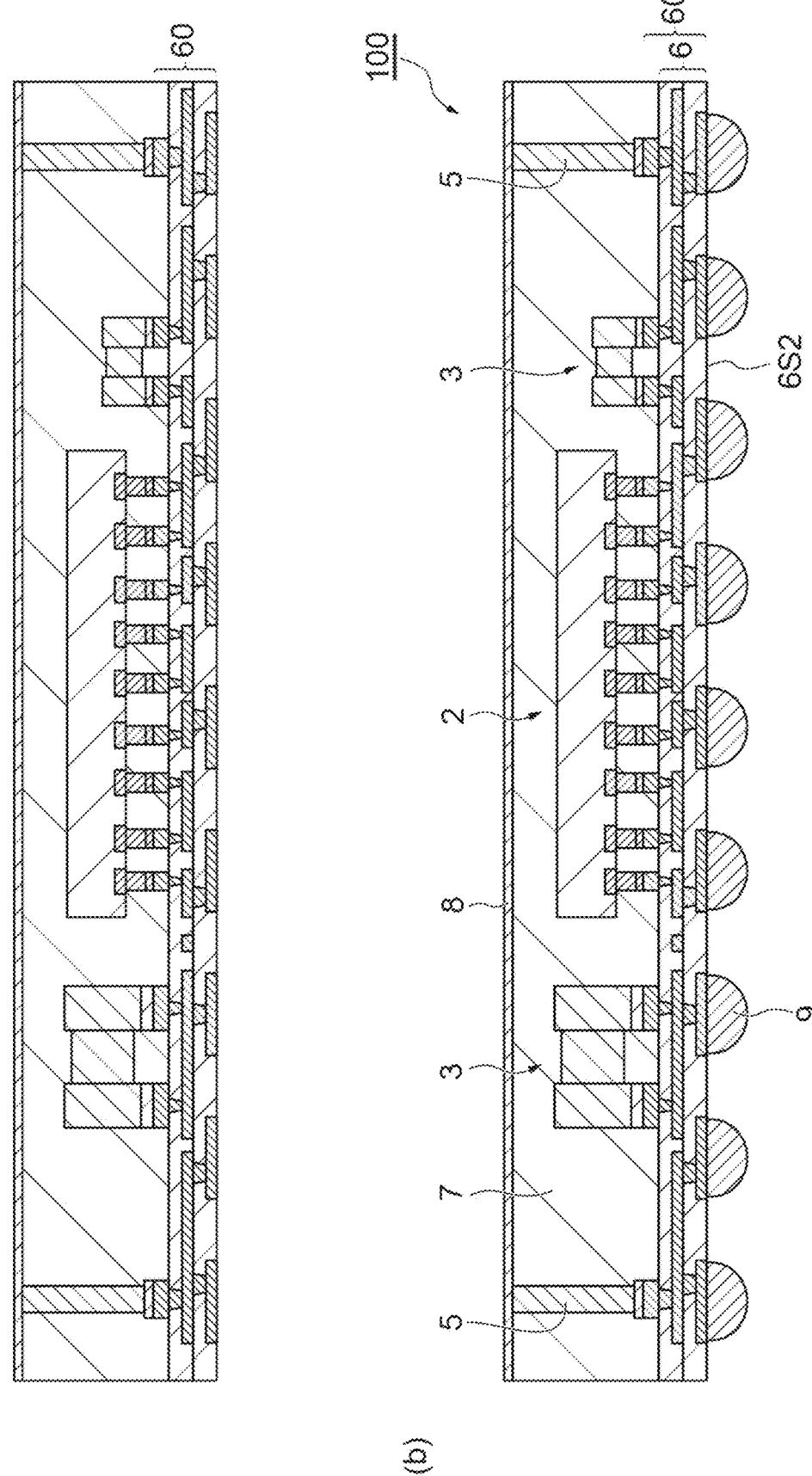
FIG. 4 is a process diagram showing an example of a method for manufacturing an electronic component device.

The present invention is not limited to the following examples.
FIGS. 1, 2, 3, and 4 are process diagrams showing an example of a method for manufacturing an electronic component device. The method shown in FIGS. 1 to 4 includes: preparing a wiring structure 60 having a wiring portion 6 that includes a metal wiring 61 and an insulating layer 62 and has two main surfaces 6S1 and 6S2 opposite to each other, and a plurality of connection portions 65, 66, and 67 provided on one main surface 6S1 of the wiring portion 6; fixing two or more conductor pins 5 on the wiring structure 60 in a state in which the two or more conductor pins 5 stand against the connection portion 67; mounting a chip component 2 and a chip-type passive component 3 as electronic components on the wiring structure 60; and forming an encapsulation layer 7 that encapsulates the electronic components (the chip component 2 and the passive component 3) and the conductor pins 5 on the wiring structure 60.

The wiring structure 60 illustrated in FIG. 1(a) is prepared in a state of being fixed on a carrier substrate 1. The carrier substrate 1 is a laminate having a support 11 and a temporary fixing material layer 12 provided on the support 11, and the wiring structure 60 is provided on the temporary fixing material layer 12. The material of the support 11 is not particularly limited as long as the material has sufficient strength and rigidity to support the electronic component. For example, the support 11 may be a silicon wafer, a glass plate, or a stainless steel plate. The thickness of the support 11 is not particularly limited, and may be, for example, 200 to 2000 µm. The temporary fixing material layer 12 has peelability to the extent that the temporary fixing material layer 12 can hold the wiring structure 60 during the mounting of the electronic component and the formation of the encapsulation layer 7 and can be finally peeled off from the wiring structure 60. The thickness of the temporary fixing material layer 12 may be, for example, 1 to 100 µm. The material forming the temporary fixing material layer 12 can be selected from materials used for the purpose of temporary fixing or temporary adhesion in the manufacture of an electronic component device (see, for example, International Publication WO 2017/057355).

The wiring portion 6 of the wiring structure 60 has the metal wirings 61 and the insulating layer 62 provided between the metal wirings 61. The metal wiring 61 includes a multilayered wiring layer 61*a* extending in a direction parallel to the main surfaces 6S1 and 6S2 of the wiring portion 6 and a connecting portion 61*b* extending in a direction perpendicular to the main surfaces 6S1 and 6S2 of the wiring portion 6. The metal wiring 61 forming the wiring portion 6 includes a rewiring connected to the chip component 2 and the passive component 3. The thickness of each wiring layer 61*a* is not particularly limited, and may be, for example, 1 to 30 µm. The thickness of the entire wiring portion 6 may be, for example, 2 to 1000 µm. The wiring portion 6 can be formed by using a normal method known to those skilled in the art. As for a method of forming a wiring portion including a metal wiring, for example, Japanese Patent No. 5494766 can be referred to.

The plurality of connection portions provided in the wiring structure 60 include a connection portion 65 connected to the chip component 2, a connection portion 66 connected to the passive component 3, and a connection portion 67 connected to the conductor pin 5, and each connection portion is connected to the metal wiring 61. The connection portions 65, 66, and 67 may be formed of the same metal as the metal wiring 61. The connection portions 65, 66, and 67 may include solder bumps. The widths of the connection portions 65, 66, and 67 may be, for example, 10 to 500 µm. The heights of the connection portions 65, 66, and 67 may be, for example, 1 to 25 µm. A plurality of connection portions 67 connected to the conductor pins 5 are arranged on one main surface 6S1 of the wiring portion 6 so as to surround the connection portions 65 and 66, which are connected to electronic components (the chip component 2 and the passive component 3) mounted on the wiring structure 60, along the outer periphery of the wiring portion 6. In other words, the plurality of connection portions 67 and the plurality of conductor pins 5 are spaced apart from each other so as to form one or more rows surrounding the electronic component. The encapsulation layer 7 is filled between two adjacent conductor pins 5 in a row formed by the conductor pins 5. The plurality of conductor pins 5 provided on the connection portion 67 arranged in this manner can function as an electromagnetic wave shield together with a shield film 8. The encapsulation layer 7 may be completely filled between two adjacent conductor pins 5 in a row formed by the conductor pins 5, but there may be a gap as long as there is no problem.

The prepared wiring structure 60 may be inspected. The inspection includes, for example, checking whether or not there is a defect due to disconnection or short circuit of the metal wiring 61 and the connection portions 65, 66, and 67.

Through this inspection, the defective wiring structure 60 can be excluded before the wiring structure 60 is connected to the electronic component. As a result, compared with a case where the wiring structure is formed on the electronic component encapsulated within the encapsulation layer, it is possible to reduce a possibility that normal electronic components are excluded due to defects in the formation of the wiring structure.

As shown in FIG. 1(*b*), the conductor pin 5 is fixed on the wiring structure 60 in a state in which the conductor pin 5 stands against the connection portion 67. In other words, the columnar conductor pin 5 is fixed on the connection portion 67 so that the longitudinal direction of the conductor pin 5 is along a direction approximately perpendicular to the main surface 6S1 of the wiring portion 6. "The conductor pin 5 is fixed on the wiring structure 60 in a state in which the conductor pin 5 stands against the connection portion 67" means that the conductor pin 5 is fixed to the wiring structure 60 on the surface side of the connection portion 67 opposite to the wiring portion 6 and the angle between the longitudinal direction of the fixed conductor pin 5 and the main surface 6S1 of the wiring portion 6 is a right angle or close to a right angle. The angle between the longitudinal direction of the fixed conductor pin 5 and the main surface 6S1 of the wiring portion 6 may be, for example, 85° to 95°. One end of the conductor pin 5 is bonded to the connection portion 67 through a solder film 50, so that the conductor pin 5 is electrically connected to the connection portion 67.

Figure 5:
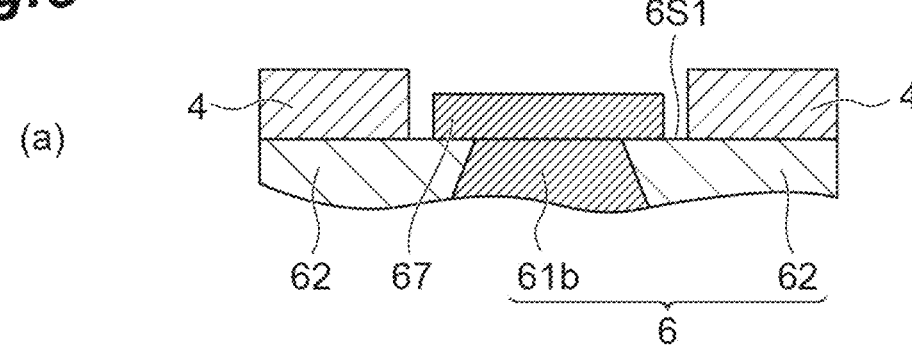
FIG. 5 is a process diagram showing an example of a method for fixing a conductor pin onto a wiring structure.
Figure 5:
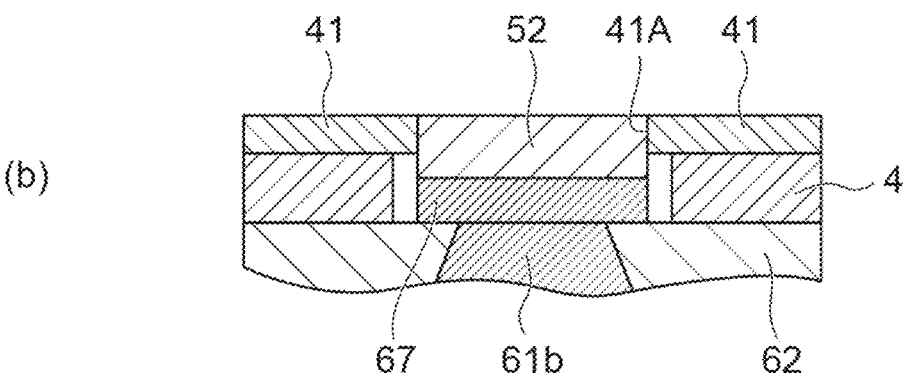
Figure 5:
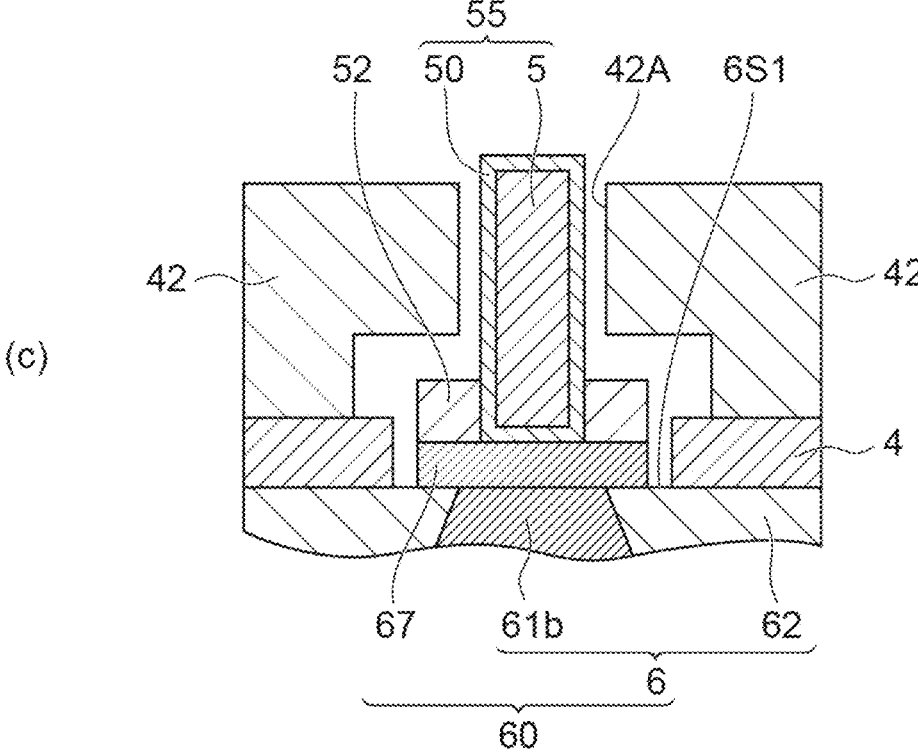
Figure 6:
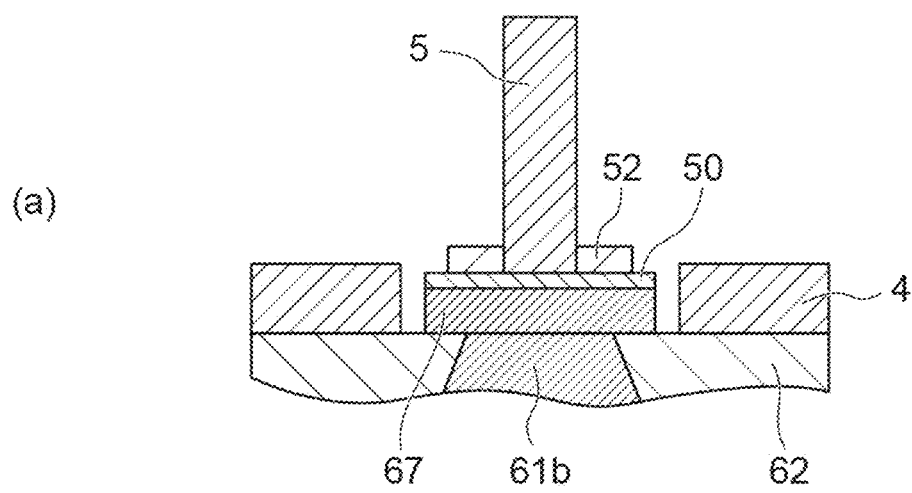
FIG. 6 is a process diagram showing an example of a method for fixing a conductor pin onto a wiring structure.
Figure 6:
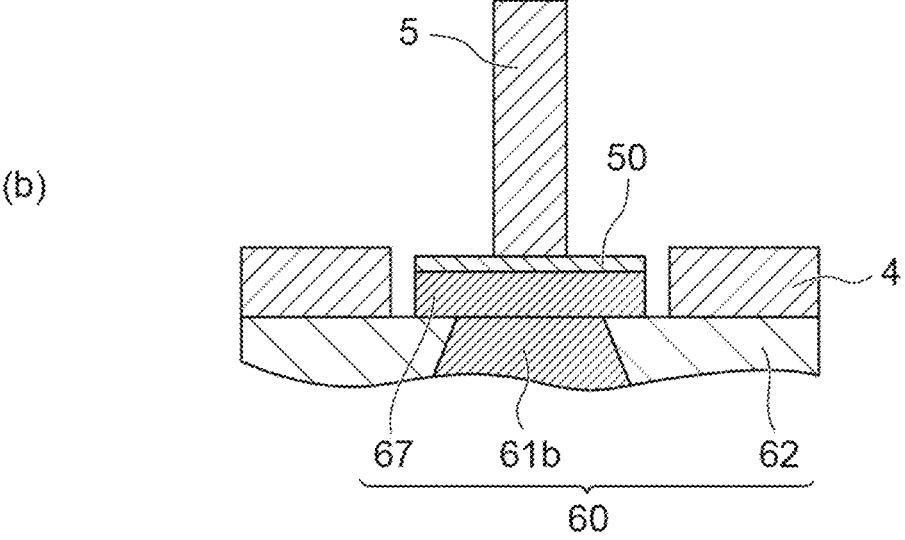

FIGS. 5 and 6 are process diagrams showing an example of a method for fixing the conductor pin 5 onto the wiring structure 60. The method shown in FIGS. 5 and 6 includes: arranging a mask 41 that has an opening 41A provided at a position corresponding to the connection portion 67, on the main surface 6S1 side of the wiring portion 6 where the connection portion 67 is provided and introducing a flux agent 52 onto the connection portion 67 located inside the opening 41A; arranging a mask 42, which has an opening 42A provided at a position corresponding to the connection portion 67, on the main surface 6S1 side of the wiring portion 6 where the connection portion 67 is provided and inserting a solder-coated pin 55 that has the conductor pin 5 and the solder film 50 that covers the surface of the conductor pin 5, through the opening 42A so that the solder-coated pin 55 is arranged on the connection portion 67 in a state in which the solder-coated pin 55 stands against the connection portion 67; fixing the conductor pin 5 so as to be electrically connected to the connection portion 67 through the solder film 50 by melting the solder film 50; and removing the flux agent 52. A surface insulating layer 4, such as a solder resist, may be arranged on the insulating layer 62.

By using the flux agent 52, good connection by the solder film 50 can be easily obtained. The flux agent 52 is not particularly limited, and can be arbitrarily selected by those skilled in the art. The flux agent 52 is introduced onto the connection portion 67 by using, for example, a printing method.

The conductor pin 5 forming the solder-coated pin 55 may be a metal molded body having a columnar portion. The conductor pin 5 may be a columnar metal molded body containing at least one metal selected from copper, gold, aluminum, silver, and the like. The maximum width (maximum width of a cross section perpendicular to the longitudinal direction) of the conductor pin 5 (or its columnar portion) may be, for example, 10 to 500 µm or 50 to 200 µm. The length of the conductor pin 5 (or the columnar portion) may be, for example, 50 to 1000 µm, or 100 to 500 µm. The ratio of the length of the conductor pin 5 (or the columnar portion) to the maximum width of the conductor pin 5 (or the columnar portion) may be 2 to 10. The solder film 50 covers the entirety or part of the outer surface of the conductor pin 5 (or the columnar portion). The thickness of the solder film 50 may be, for example, 0.1 to 10 μm.

For example, by using a method including scattering a number of solder-coated pins 55 (or the conductor pins 5) exceeding the number of openings 42A on the mask 42 and vibrating the wiring structure 60 and the mask 42, the solder-coated pins 55 (or the conductor pins 5) can be inserted through the opening 42A. The minimum width of the opening 42A is generally greater than the maximum width of the solder-coated pin 55 (or the conductor pin 5).

When the solder film 50 is melted by heating the solder-coated pin 55 arranged on the connection portion 67 in a state in which the solder-coated pin 55 stands against the connection portion 67, the solder film 50 flows to move onto the connection portion 57. By the solder film 50 on the connection portion 67, the conductor pin 5 is fixed onto the wiring structure 60 and electrically connected to the connection portion 67. The heating temperature for melting the solder film 50 may be equal to or higher than the melting point of the solder film 50. For example, when the solder film 50 is a Sn—Ag—Cu based lead-free solder film, the heating temperature may be 250 to 300° C.

After the conductor pin 5 is introduced, as shown in FIG. 2(a), electronic components (the chip component 2 and the passive component 3) are mounted on the wiring structure 60. The order of mounting the chip component 2 and the passive component 3 is arbitrary. After mounting the chip component 2 and the passive component 3 on the wiring structure 60, the conductor pin 5 may be introduced onto the wiring structure 60.

The chip component 2 is electrically connected to the connection portion 65. The chip component 2 has an IC chip 21 and a plurality of connection portions 22 provided on the IC chip 21. The connection portion 22 may have a columnar portion 22A containing metal and a bump 22B provided on the columnar portion 22A. The maximum width of the chip component 2 in a direction parallel to the main surface 6S1 may be, for example, 0.1 to 50 mm.

The passive component 3 is electrically connected to the connection portion 66. The passive component 3 is selected according to the design of the electronic component device, and may be, for example, a resistor, a capacitor, or a combination thereof. The passive component 3 is electrically connected to the connection portion 66 through a bump 32, for example. The maximum width of the passive component 3 in a direction parallel to the main surface 6S1 may be 0.05 to 2 mm, 1 to 2 mm, 0.5 to 1 mm, or 0.1 to 0.5 mm.

After the conductor pin 5, the chip component 2, and the passive component 3 are fixed on the wiring structure 60, the encapsulation layer 7 for encapsulating these is formed by using a sealing resin material, as shown in FIG. 2(b). The encapsulation layer 7 is formed so as to completely embed the conductor pin 5 and the electronic components (the chip component 2 and the passive component 3). If there is a gap between the electronic component and the wiring structure, a part or entirety of the gap may be filled with the encapsulation layer 7. The encapsulation layer 7 can be formed in a mold by using, for example, a compression or transfer type molding machine. Alternatively, the encapsulation layer 7 may be formed by using a film-shaped sealing resin material (see, for example, International Publication WO 2015/186744). In this case, from the viewpoint of preventing entrainment of air bubbles, the film-shaped sealing resin material may be laminated under reduced pressure.

By grinding the formed encapsulation layer 7 from the surface opposite to the wiring structure 60, the distal ends of the conductor pin 5 is exposed as shown in FIG. 3(a). Grinding of the encapsulation layer 7 can be performed by using a normal grinding device.

Subsequently, as shown in FIG. 3(b), a conductive shield film 8 is formed to cover the surface of the encapsulation layer 7 opposite to the wiring structure 60. The shield film 8 is connected to the distal end of the conductor pin 5. The shield film 8 is provided mainly for the purpose of electromagnetic wave shielding. The thickness of the shield film 8 may be, for example, 0.1 to 100 μm. The shield film 8 can be a single-layer or multilayered metal thin film, which can be formed by using a method such as sputtering, vapor deposition, or plating.

As shown in FIG. 4(a), the carrier substrate 1 is peeled off from the wiring structure 60. The carrier substrate 1 having the temporary fixing material layer 12 can be peeled off from the wiring portion 6 by, for example, heating, light irradiation, mechanical peeling, or a combination thereof.

After peeling off the carrier substrate 1, as shown in FIG. 4(b), a solder ball 9 connected to the metal wiring 61 may be provided on the main surface 6S2 of the wiring portion 6 opposite to the encapsulation layer 7. The solder ball 9 is used as a connection terminal for secondary mounting. Reflow is performed as necessary.

An electronic component device 100 is obtained by the method illustrated above. The electronic component device 100 is configured to mainly include the wiring structure 60, a plurality of electronic components (the chip component 2 and the passive component 3) mounted on the wiring structure 60, the encapsulation layer 7 that encapsulates the electronic components and the conductor pin 5, and the conductor pin 5 penetrating through the encapsulation layer 7 in a state in which the conductor pin 5 stands against the connection portion 67.

The method for manufacturing an electronic component device is not limited to the example described above, and can be modified as necessary. For example, a wiring structure corresponding to a plurality of electronic component devices may be formed on a single large-area carrier substrate.

Figure 7:
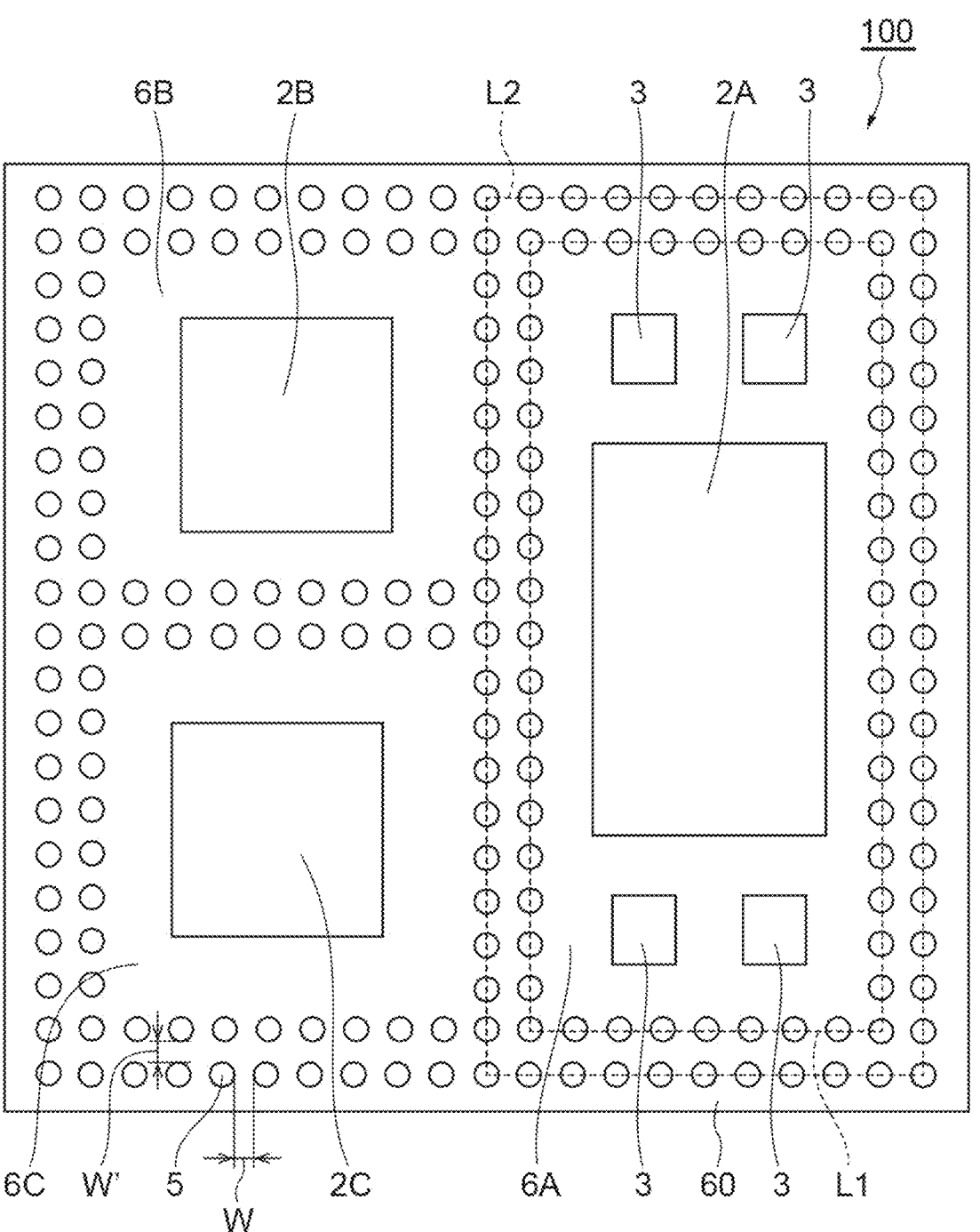
FIG. 7 is a plan view showing an example of an electronic component device.

FIG. 7 is a plan view showing an example of the arrangement of conductor pins in an electronic component device. In FIG. 7, the encapsulation layer 7 and the shield film 8 are omitted. In the electronic component device 100 shown in FIG. 7, a plurality of conductor pins 5 are arranged to form one or more annular rows. The row formed by the conductor pins 5 divides the main surface of the wiring portion 6 on the connection portion side into three mounting regions 6A, 6B, and 6C. An electronic component is arranged in each of the mounting regions. For example, a chip component 2A and the passive components 3 arranged therearound are surrounded by two rows L1 and L2 extending along the outer periphery of the mounting region 6A where the chip component 2A and the passive components 3 are arranged. The row L1 and the row L2 outside thereof extend along the outer periphery of the mounting region 6A without crossing each other, and surround the chip component 2A and the passive components 3. The mounting regions 6B and 6C where chip components 2B and 2C are arranged, respectively, are also surrounded by two rows extending along the outer periphery thereof. Parts of the rows L1 and L2 surrounding the chip component 2A also serve as rows extending along the outer periphery of the mounting regions 6B and 6C where the chip components 2B and 2C are arranged, respectively.

One or more electronic components (especially chip components) are usually arranged in a mounting region inside one or more rows formed by a plurality of conductor pins. The number of rows extending along the outer periphery of one mounting region may be two or more or three or more, or may be one. If the electronic component is surrounded by two or more rows formed by conductor pins, a higher electromagnetic wave shielding effect is likely to be obtained.

A distance W between the two conductor pins 5 adjacent to each other in the same row may be, for example, 500 μm or less. Even if the conductor pins 5 are spaced apart from each other, if the distance W is small, a sufficient electromagnetic wave shielding effect can easily be obtained even if no conductor material is provided between the conductor pins 5. From a similar point of view, the distance W may be 300 μm or less, 200 μm or less, or 100 μm or less. The distance W exceeds 0 μm from the viewpoint of process stability, reduction in the number of required conductor pins 5, and the like. From a similar point of view, the distance W may be 50 μm or more, 75 μm or more, or 100 μm or more.

When two or more rows extend along the periphery of the mounting region where electronic components are arranged, a distance W' between two adjacent rows may be 100 μm or more and 500 μm or less. The distance W' can be the minimum value of the distance between the conductor pins forming the two adjacent rows.

Figure 8:
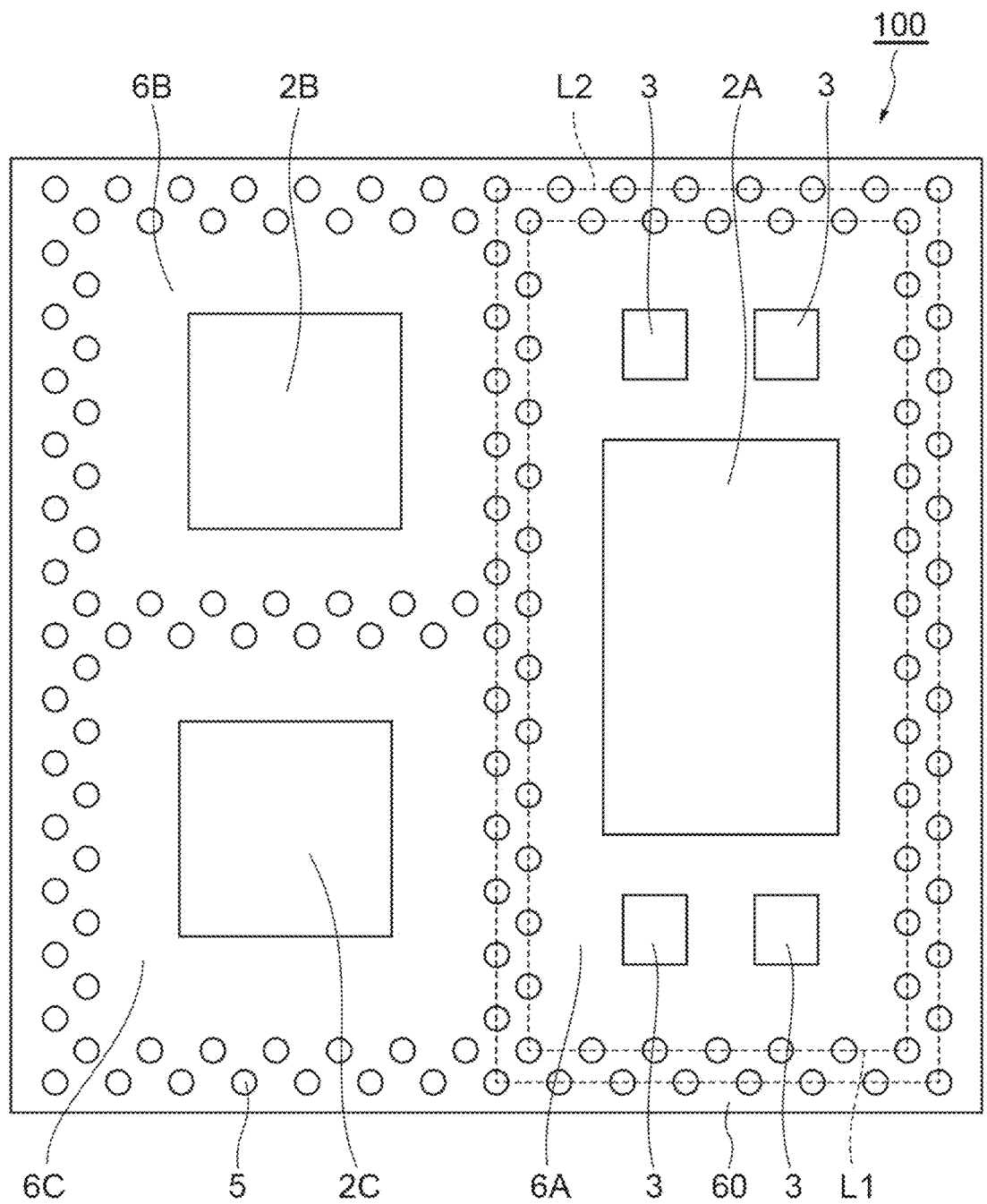
FIG. 8 is a plan view showing an example of an electronic component device.

As in another example shown in FIG. 8, in two or more rows (for example, L1 and L2) that extend along the outer periphery of the mounting region where electronic components are arranged and do not cross each other, a plurality of conductor pins 5 may be arranged in a staggered arrangement. "Staggered arrangement" means that the conductor pins forming the two rows are arranged in a staggered manner in a direction in which the two adjacent rows extend. When the conductor pins 5 are arranged in a staggered arrangement, it is possible to obtain a high electromagnetic wave shielding effect while using a smaller number of conductor pins 5.

Hereinafter, an example of a test for fixing a conductor pin on a wiring structure in a state in which the conductor pin stands against a connection portion will be described.

A test wiring structure, which was arranged on an insulating layer and had a connection portion having a circular cross-section with a diameter of 200 μm, was prepared. The wiring structure had a surface insulating layer provided on the insulating layer and having a circular opening surrounding the connection portion. In the same manner as in the step shown in FIG. 5(*b*), the mask 41 (metal mask) having a thickness of 30 μm and having a circular opening 41A with a diameter of 190 μm provided at a position corresponding to the connection portion 67 was placed on the wiring structure, and a water-soluble flux agent ("WF-6457" manufactured by SENJU METAL INDUSTRY CO., LTD.) was printed to introduce the flux agent 52 onto the connection portion 67.

Then, in the same manner as in the step shown in FIG. 5(*c*), the mask 42 (metal mask) having a thickness of 145 μm (including a rib height of 45 μm) and having a circular opening 42A with a diameter of 92 μm provided at a position corresponding to the connection portion 67 was placed on the wiring structure 60, and the solder-coated pin 55 (76 μm in diameter and 180 μm in length, manufactured by FINECS CO., LTD.) having the conductor pin 5 (copper pin) and the solder film 50 was inserted through the opening 42A of the mask 42 by using a conductor pin mounting machine ("SBP662" manufactured by SHIBUYA CORPORATION). As a result, the solder-coated pin 55 was arranged on the connection portion 67 in a state in which the solder-coated pin 55 stood against the connection portion 67.

Subsequently, in the same manner as in the step shown in FIG. 6(*a*), the solder film 50 was melted by reflow at a maximum temperature of 265° C. in a nitrogen atmosphere. As a result, the conductor pin 5 was fixed so that the conductor pin 5 and the connection portion 57 are electrically connected to each other through the solder film 50.

Figure 9:
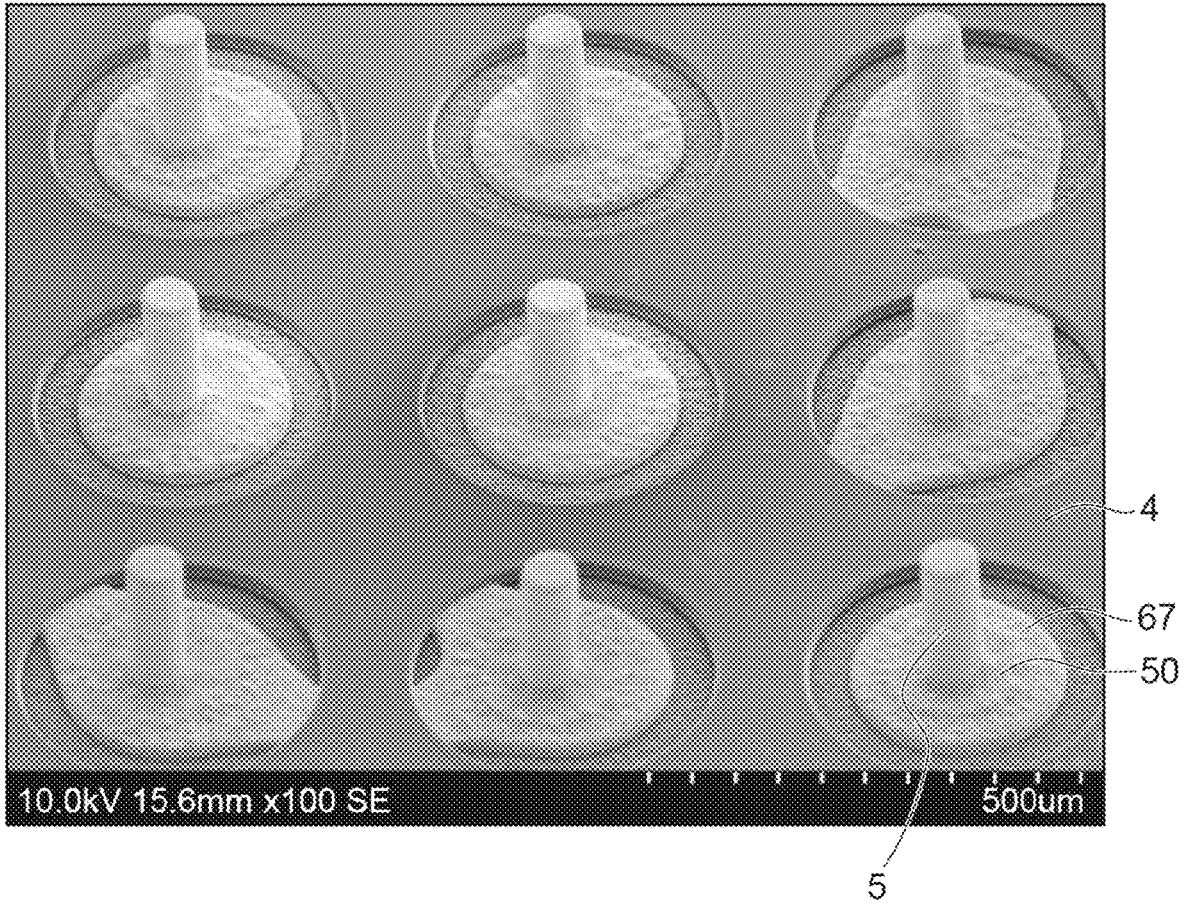
FIG. 9 is a micrograph of a wiring structure and conductor pins fixed on the wiring structure.

Finally, in the same manner as in the step shown in FIG. 6(*b*), the flux agent 52 was removed by washing. FIG. 9 is a micrograph of a wiring structure and conductor pins fixed on the wiring structure manufactured by the method described above. As shown in the photograph of FIG. 7, it was confirmed that the conductor pin 5 could be fixed on the wiring structure in a state in which the conductor pin 5 stood against the connection portion 67.

REFERENCE SIGNS LIST

1: carrier substrate, 2: chip component (electronic component), 3: passive component (electronic component), 5: conductor pin, 6: wiring portion, 6S1, 6S2: main surface of wiring portion, 7: encapsulation layer, 8: shield film, 11: support, 12: temporary fixing material layer, 22, 65, 66, 67: connection portion, 41, 42: mask, 41A, 42A: opening, 50: solder film, 55: solder-coated pin, 60: wiring structure, 61: metal wiring, 62: insulating layer, 100: electronic component device.

The invention claimed is:

1. A method for manufacturing an electronic component device, comprising:

preparing a wiring structure comprising a wiring portion comprising a metal wiring and an insulating layer, the wiring portion having two main surfaces opposite to each other, and a connection portion provided on a mounting surface selected from one of the two main surfaces of the wiring portion;

fixing a plurality of conductor pins on the connection portion, wherein each of the plurality of conductor pins are formed as a metallic columnar-shaped body having a uniform width that is less than a length which extends perpendicular to the mounting surface of the wiring structure;

mounting one or more electronic components on the wiring structure; and forming an encapsulation layer for encapsulating the one or more electronic components and the plurality of conductor pins on the wiring structure.

2. The method according to claim 1, wherein the one or more electronic components are arranged in a mounting region on the mounting surface of the wiring portion, some or all of the plurality of conductor pins are spaced apart from each other so as to form one row that surrounds the mounting region, and the encapsulation layer is filled between adjacent conductor pins in the one row.

3. The method according to claim 2, wherein the plurality of conductor pins additionally forms a second row that extends along an outer periphery of the mounting region and does not cross the one row.

4. The method according to claim 3, wherein conductor pins of the second row are offset from conductor pins of the one row that extend along the outer periphery of the mounting region, such that the plurality of conductor pins are arranged in a staggered arrangement.

5. The method according to claim 2, wherein a distance between the adjacent conductor pins in the one row is more than 50 μm and 250 μm or less.

6. The method according to claim 1, further comprising:

forming a conductive shield film that covers the encapsulation layer and is connected to a distal end of each of the plurality of conductor pins.

7. The method according to claim 1, further comprising:

exposing distal ends of the plurality of conductor pins by grinding the encapsulation layer from a surface opposite to the wiring structure.

8. The method according to claim 1, wherein the plurality of conductor pins are fixed on the wiring structure by:

arranging a mask having openings on the mounting surface side of the wiring structure; and inserting the plurality of conductor pins through the openings in an upright position on the connection portion.

9. The method according to claim 1, wherein the plurality of conductor pins are fixed to the connection portion by melting a solder film covering an outer surface of the plurality of conductor pins along the length of the columnar-shaped body so that the solder film melts onto the connection portion, and electrically connects the plurality of conductor pins to the connection portion through the melted solder.

10. The method according to claim 1, wherein the columnar-shaped body of the plurality of conductor pins has a maximum width of 500 μm and a maximum length of 1000 μm.

11. The method according to claim 1, wherein the plurality of conductor pins are fixed on the wiring structure by:

arranging a mask having openings on the mounting surface of the wiring portion;

scattering the plurality of conductor pins on the mask; and vibrating the wiring structure and the mask, thereby inserting the plurality of conductor pins through the openings.

12. A method for manufacturing an electronic component device, comprising:

preparing a wiring structure including a wiring portion comprising a metal wiring and an insulating layer, the wiring portion having two main surfaces opposite to each other, and a connection portion provided on a mounting surface selected from one of the two main surfaces of the wiring portion; mounting one or more electronic components on the mounting surface of the wiring structure;

fixing a plurality of conductor pins on the connection portion; and forming an encapsulation layer for encapsulating the one or more electronic components and the plurality of conductor pins on the wiring structure, wherein a first set of the plurality of conductor pins are spaced apart from each other so as to form a first row of pins that surrounds the one or more electronic components, a second set of the plurality of conductor pins are spaced apart from each other so as to form a second row of pins that surrounds the one or more electronic components without crossing the first row of pins, and the second set of pins are offset from the first set of pins such that the plurality of conductor pins are arranged in a staggered arrangement around the one or more electronic components.

13. The method according to claim 12, wherein each of the plurality of conductor pins are formed as a columnar-shaped body having a width that is less than half of a length which extends perpendicular to the mounting surface of the wiring structure.

* * * * *